United States Patent
Chao et al.

(10) Patent No.: US 7,313,746 B2
(45) Date of Patent: Dec. 25, 2007

(54) TEST OUTPUT COMPACTION FOR RESPONSES WITH UNKNOWN VALUES

(75) Inventors: Chia-Tso Chao, Goleta, CA (US);
Seongmoon Wang, Plainsboro, NJ (US); Srimat T. Chakradhar, Manalapan, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 157 days.

(21) Appl. No.: 11/277,782

(22) Filed: Mar. 29, 2006

(65) Prior Publication Data

US 2007/0088999 A1 Apr. 19, 2007

Related U.S. Application Data

(60) Provisional application No. 60/722,097, filed on Sep. 30, 2005.

(51) Int. Cl.
*G01R 31/28* (2006.01)

(52) U.S. Cl. .................................... 714/729; 714/727
(58) Field of Classification Search ................ 702/185; 714/724, 732, 731, 729, 727
See application file for complete search history.

(56) References Cited

U.S. PATENT DOCUMENTS

| | | | | |
|---|---|---|---|---|
| 5,038,349 | A * | 8/1991 | Lipp ........................... | 714/724 |
| 6,829,740 | B2 * | 12/2004 | Rajski et al. ................ | 714/729 |
| 7,032,148 | B2 * | 4/2006 | Wang et al. ................. | 714/729 |
| 7,210,083 | B2 * | 4/2007 | Grinchuk et al. ........... | 714/732 |
| 7,222,277 | B2 * | 5/2007 | Wang et al. ................. | 714/726 |
| 7,239,978 | B2 * | 7/2007 | Cheng et al. ................ | 702/185 |

* cited by examiner

*Primary Examiner*—David Ton

(57) ABSTRACT

A spatial compactor design and technique for the compaction of test response data is herein disclosed which advantageously provides a scan-out response with multiple opportunities to be observed on different output channels in one to several scan-shift cycles.

16 Claims, 9 Drawing Sheets

(A)

(B)

$$\begin{pmatrix} 1 & 1 & 1 \\ 0 & 0 & 0 \end{pmatrix} \begin{pmatrix} 0 & 0 & 0 \\ 1 & 1 & 1 \end{pmatrix} \begin{pmatrix} 1 & 1 & 0 \\ 0 & 0 & 1 \end{pmatrix} \begin{pmatrix} 0 & 0 & 1 \\ 1 & 1 & 0 \end{pmatrix} \begin{pmatrix} 1 & 0 & 1 \\ 0 & 1 & 0 \end{pmatrix} \begin{pmatrix} 0 & 1 & 0 \\ 1 & 0 & 1 \end{pmatrix} \begin{pmatrix} 1 & 0 & 0 \\ 0 & 1 & 1 \end{pmatrix} \begin{pmatrix} 0 & 1 & 1 \\ 1 & 0 & 0 \end{pmatrix}$$

chain 1    chain 2    chain 3    chain 4    chain 5    chain 6    chain 7    chain 8

FIG. 4

$$\begin{pmatrix} 1 & 1 & 0 \\ 0 & 0 & 0 \end{pmatrix} \begin{pmatrix} 0 & 0 & 0 \\ 1 & 0 & 1 \end{pmatrix} \begin{pmatrix} 0 & 1 & 0 \\ 0 & 0 & 1 \end{pmatrix} \begin{pmatrix} 0 & 0 & 1 \\ 0 & 0 & 1 \end{pmatrix} \begin{pmatrix} 1 & 0 & 0 \\ 0 & 0 & 1 \end{pmatrix} \begin{pmatrix} 0 & 0 & 1 \\ 0 & 1 & 0 \end{pmatrix} \begin{pmatrix} 1 & 0 & 1 \\ 0 & 0 & 0 \end{pmatrix} \begin{pmatrix} 0 & 0 & 0 \\ 1 & 1 & 0 \end{pmatrix}$$

chain 1    chain 2    chain 3    chain 4    chain 5    chain 6    chain 7    chain 8

FIG. 5

| time output | t-1 | t | t+1 | t+2 | t+3 | ..... |
|---|---|---|---|---|---|---|
| $Z_1$ | | u | u | | u | |
| $Z_2$ | | | u | u | | |

(a) Output observation if $R_{31}$ and $R_{42}$ are unknown

| time output | t-1 | t | t+1 | t+2 | t+3 | ..... |
|---|---|---|---|---|---|---|
| $Z_1$ | | e | | | | |
| $Z_2$ | | | e | e | | |

(b) Output observation if $R_{71}$ is an error

FIG. 9

TEST OUTPUT COMPACTION FOR RESPONSES WITH UNKNOWN VALUES

This application claims the benefit of and is a non-provisional of U.S. Provisional Application No. 60/722,097, entitled "TEST OUTPUT COMPACTION FOR RESPONSES WITH UNKNOWN VALUES," filed on Sep. 29, 2005, the contents of which are incorporated by reference herein.

BACKGROUND OF THE INVENTION

The present invention is related to testing of logic circuit designs and, in particular, to compaction of test response data.

Testing of complicated digital logic circuits requires the analysis of a large amount of test response data. A variety of output compaction techniques have been devised for reducing the size of test response data stored in test memory. Techniques to reduce output responses can be classified into two basic categories: "spatial compaction" and "temporal compaction." Temporal compaction compresses output responses over a period of time into a signature, the signature being significantly smaller than the size of even a single uncompressed output response. Spatial compaction, on the other hand reduces response data volume by reducing the number of outputs that are observed by the automatic test equipment (ATE).

A key barrier to effective output response compaction is the presence of what are referred to as "unknown" values when computing the good-circuit responses. Unknown values can occur for many reasons: the presence of non-scan flip-flops, embedded memories, tristate buffers, the limitation in accuracy of simulation, etc. For a simple spatial compactor built with XOR trees, an output that has a fault effect can appear along with an unknown value at a given scan shift cycle, resulting in the masking of the fault effect. The fault effect cannot be observed at the output of the compactor during that cycle. It is difficult and costly to eliminate all unknown sources from the design, and, thus, it is preferable that the output response compaction technique take into account the presence of unknown values. FIG. 1A depicts one such prior art spatial compaction scheme referred to in the art as an "X-compactor." See S. Mitra and K. S. Kim, "X-Compact: An Efficient Response Compaction Technique for Test Cost Reduction," IEEE International Test Conference, pp. 311-20 (2002). The outputs of every scan-chain depicted in FIG. 1B are connected to three outputs, and the outputs of no two scan chains are connected to the same three outputs, thereby ensuring that an error can be observed without being masked even if the error is scanned out along with an unknown value at a clock cycle. FIG. 1B depicts an example of another prior art spatial compaction scheme referred to as a "block compactor." See C. Wang et al., "On Compacting Test Response Data Containing Unknown Values," ACM/IEEE International Conference on Computer Aided Design, pp. 855-62 (November 2003). The block compactor uses flip-flops arranged as depicted in FIG. 1B as well as XOR gates to increase the possible combinations of scan chains that can be connected to the XOR array.

Although all of these spatial compaction schemes guarantee that no single error value is masked by a single unknown value, they unfortunately provide varying probabilities of unknown masking when multiple unknown values are present among responses. It would be advantageous to have a more analytical approach to spatial compaction which allowed for the systematic derivation of masking probability in designing an optimal compactor configuration.

SUMMARY OF INVENTION

A spatial compactor design and technique for the compaction of test response data is herein disclosed which advantageously provides a scan-out response with multiple opportunities to be observed on different output channels in one to several scan-shift cycles. The compactor receives test response values from a plurality of scan chains and from different scan-shift cycles within a scan chain. The compactor combines the test response values using a plurality of sub-arrays of logic gates to directly generate output values at a plurality of external outputs, the number of external outputs being less than the number of scan chains. The sub-arrays of logic gates, preferably XOR gates, are arranged so as to minimize the masking of errors in the test response data. Memory elements can be added to a sub-array so as to store the test response data from different scan-shift cycles within a scan chain. The sub-arrays can be represented by a matrix where the number of rows in the matrix is equal to the number of external outputs and the number of columns in the matrix is equal to the number of different scan-shift cycles used within a scan chain. In one embodiment, referred to as a regular-type compactor, each sub-array matrix has a same number of logic gates in each column of the matrix and no two matrices are identical. In a second embodiment, referred to as a flexible-type compactor, there are a fixed number of logic gates within each sub-array and no sub-array is represented by a matrix which is a horizontally-shifted version of another sub-array's matrix. The compactor, in general, can be considered a time-folded enhancement to the X-compactor which advantageously extends compaction into the time domain.

In another embodiment, a selection scheme maybe combined with the compactor so as to improve the fault coverage. The sub-arrays can be grouped into a plurality of segments. Control signals can be used to block a segment from being combined to one of the plurality of external outputs, the control signals selected so as to minimize masking by unknown values.

The disclosed compaction design and technique can provide good compaction results while ensuring that a scan-out response has multiple chances to be observed on different ATE channels in one to several scan-shift cycles. Moreover, the compactor design and technique allows for analytic prediction of the probability that a scan-out response is masked by the unknowns. The compactor can be arranged in a manner that maximizes the probability of observing a scan-out response in the presence of unknowns. These and other advantages of the invention will be apparent to those of ordinary skill in the art by reference to the following detailed description and the accompanying drawings.

BRIEF DESCRIPTION OF DRAWINGS

FIG. 4 depicts matrices representing the structure of the XOR sub-arrays in the compactor depicted in FIG. 2.

FIG. 5 depicts matrices representing the structure of the XOR sub-arrays in an example of a F-type compactor, arranged in accordance with another embodiment of the present invention.

FIG. 9A and 9B are timing tables illustrating the operation of the selection scheme depicted in FIG. 8.

DETAILED DESCRIPTION

Figure 2:
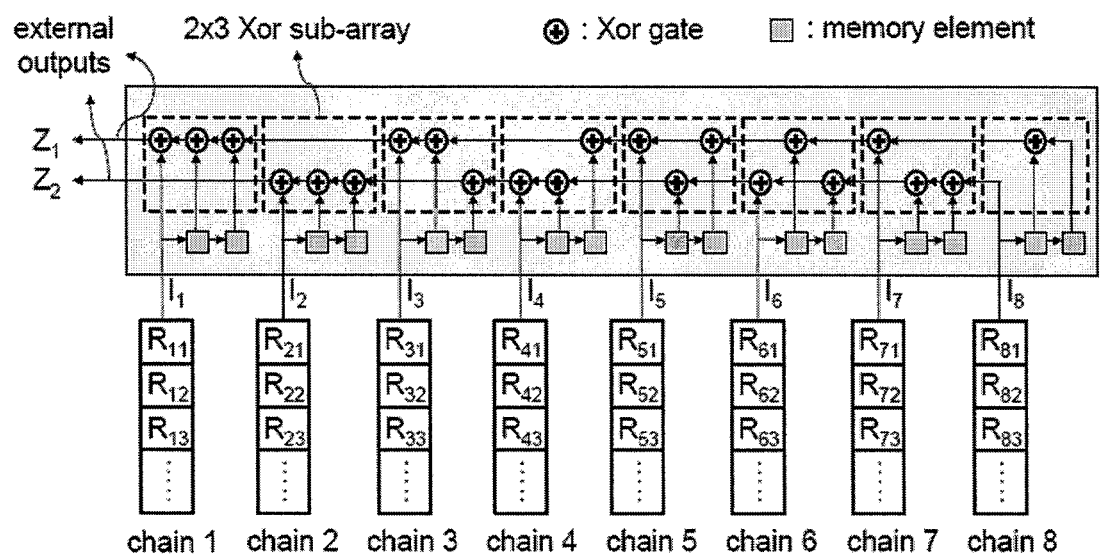
FIG. 2 is a block diagram of an exemplary compactor, arranged in accordance with an embodiment of the present invention.

FIG. 2 is a block diagram depicting an exemplary compactor, arranged in accordance with an embodiment of the present invention. The inventors refer to the compactor 200 as a "Chi-Yun" compactor. The compactor 200 depicted in FIG. 2 illustratively comprises eight inputs 211, ..., 218 and two external outputs 291, 292. Each input connects to a scan chain 201, ..., 208 and each external output 291, 292 connects to a tester channel.

The compactor 200 comprises logic gates, preferably XOR gates, grouped into sub-arrays 221, ..., 228. For each scan chain 201, ..., 208, the compactor includes an XOR sub-array and memory elements arranged so as to propagate a response into different external outputs 291, 292 in different scan-shift cycles. The number of rows in a sub-array is equal to the number of external outputs; the number of columns is one more than the number of memory elements used in the sub-array. As depicted in FIG. 2, the input of the first column in an XOR sub-array is the current response of the scan-chain output; the inputs of its second and third column are the responses of the same scan-chain output from one cycle earlier and two cycles earlier, respectively. For each column, an XOR gate is used to propagate an input response to an external output. The ith row of an XOR sub-array is connected to the ith row of all other sub-arrays through XOR gates, and the XOR result will propagate to the corresponding external output (Zi). When a scan-out response arrives at an input of the compactor, this response will be stored in memory elements and, hence, can be observed at external outputs in multiple scan-shift cycles.

FIG. 3A and 3B show two examples of how a response can be observed at the external outputs of the illustrative compactor in FIG. 2. $R_{ij}$ denotes the response in the jth scan cell of the ith scan chain. As shown in FIG. 3A, response $R_{31}$ arrives in the compactor input 213 ($I_3$) in scan-shift cycle t and will be propagated to external outputs through the corresponding XOR sub-array of scan chain 203. In scan-shift cycle t, $R_{31}$ is the input to the first column of the XOR sub-array and, hence, can be observed by external output 291 ($Z_1$). In scan-shift cycle t+1, $R_{31}$ moves to the memory element right next to input 213 ($I_3$) and becomes the input to the second column of the sub-array. Hence, $R_{31}$ is observed at external output 291 ($Z_1$) in scan-shift cycle t+1. In scan-shift cycle t+2, $R_{31}$ moves to the right-most memory element right of the sub-array and becomes the input to the third column of the sub-array. Hence, $R_{31}$ is observed at external output 292 ($Z_2$) in scan-shift cycle t+2. Similarly, $R_{42}$ arrives at the compactor in scan=shift cycle t+1 and will be observed at outputs in scan-shift cycles t+1 to t+3 as shown in FIG. 3B.

FIG. 3C and 3D show how error values and unknown values could interact with one another. If $R_{31}$ and $R_{42}$ are both error values, two error values will cancel each other at $Z_2$ in scan-shift cycle t+2, and the external outputs will observe four error values as shown in FIG. 3C. If $R_{31}$ and $R_{42}$ are both unknown values, the external outputs will observe five unknown values as shown in FIG. 3D. With the distribution of unknown values in FIG. 3D, some responses (other than $R_{31}$ and $R_{42}$) may not be observed at any external output in any scan-shift cycle. For example, $R_{71}$ and $R_{52}$ are propagated to an external output which observes an unknown value for the three consecutive cycles, and hence these two responses cannot be observed in any of these cycles.

FIG. 4 represents the XOR sub-arrays by binary matrices, where a 1 at element (i, j) in the matrix means the input jth column will be propagated to the ith external output through an XOR gate. From the viewpoint in time, if a response arrives at this sub-array in scan-shift cycle t, the jth column in the matrix represents which external outputs will observe this response in scan-shift cycle t+j−1.

Figure 1:
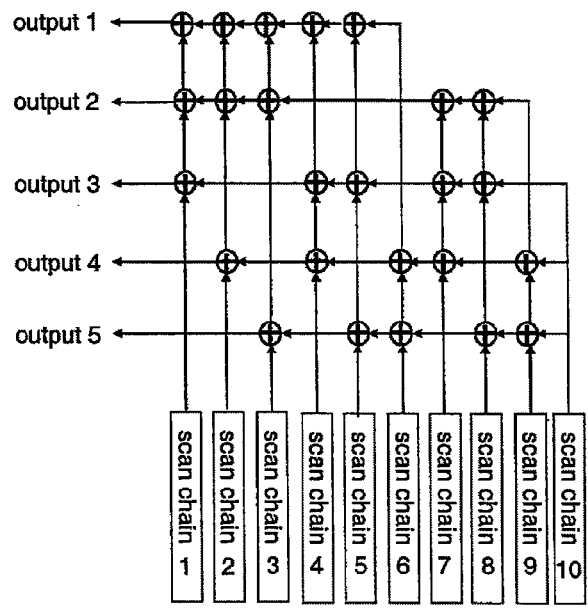
FIG. 1A and 1B show an illustrative prior art spatial compactor designs.
Figure 1:
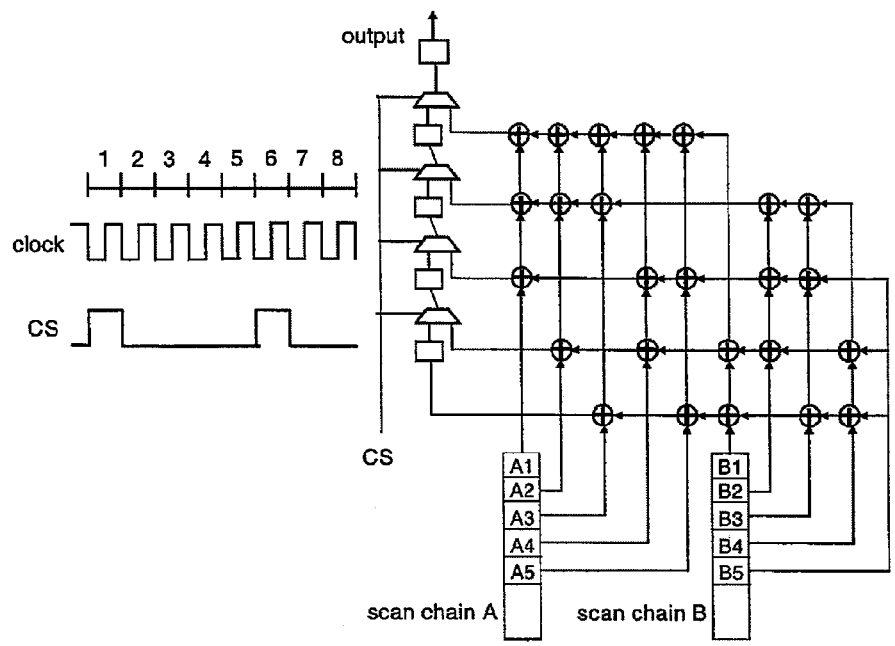

It is instructive to compare the embodiment depicted in FIG. 2 with the prior art block compactor depicted in FIG. 1B. Note the difference in the output portions of the compactor designs. A prior art block compactor requires a special control scheme for shifting out the XOR results while the Chi-Yun compactor embodiment depicted in FIG. 2 does not. Moreover, after capturing the XOR results at one of the outputs, a block compactor takes several scan-shift cycles to shift the captured XOR results out; all of the XOR results produced during those scan-shift cycles are discarded. Accordingly, for a prior art block compactor, one response has only one chance to be observed at an external output. On the other hand, the Chi-Yun compactor design disclosed herein observes the XOR results in every scan-shift cycle and, hence, each response has multiple chances to be observed at an external output for several scan-shift cycles. The Chi-Yun compactor design, therefore, can more fully utilize the results of its XOR array and potentially can achieve a higher compaction ratio.

The XOR sub-arrays can be constructed in a number of different ways. Here, the inventors disclose two advantageous ways of constructing the XOR sub-arrays, which the inventors refer to respectively as a regular-type (R-type) Chi-Yun compactor and as a flexible-type (F-type) Chi-Yun compactor.

The XOR sub-array matrices for the R-type embodiment of the Chi-Yun compactor are constructed for each scan chain as follows. Assume that the sub-array is a Z×C matrix, where Z is the number of external outputs in use and C is the number of input responses for the XOR sub-array. For example, Z=2 and C=3 in FIG. 2 and FIG. 4. For an R-type Chi-Yun compactor, each XOR matrix has the same number of XOR gate in each column. The number of XOR gates n in each column is denoted as $W_R$. If no two matrices are identical, then a R-type Chi-Yun compactor can guarantee that no two errors among the scan-out responses will cancel each other out and no single error will be masked by a single unknown. To satisfy the above condition, the maximum number of scan chains ($N_{max}$) that a R-type Chi-Yun compactor can support is:

$$N_{max} = \left(\frac{Z}{W_R}\right)^C$$

where $$\binom{i}{j}$$

means the possible combinations of choosing j items from i items. Furthermore, if the number of 1's in each column is odd, a R-type Chi-Yun compactor can further guarantee that no odd number of errors would cancel one another.

It is useful to compare the maximum numbers of supported scan chains of a R-type Chi-Yun compactor with the prior art block compactor and the prior art X-compactor. For example, for the Chi-Yun compactor, set the number of matrix columns (C) to be 4 and the number XOR gates per column ($W_R$) to be 1. For a block compactor, set block size as the same as C of the Chi-Yun compactor and the number of XOR gates per column to be 3, which is larger than that of a Chi-Yun compactor. For X-compact, report the maximum number of supported scan chains with the given outputs. The results are shown in the following table.

| Outputs | R-type ChiYun C = 4, $W_R$ = 1 | Block Compactor block size = 4, W = 3 | X-Compact |
|---|---|---|---|
| 2 | 16 | 14 | 2 |
| 3 | 81 | 55 | 3 |
| 4 | 256 | 140 | 4 |
| 5 | 625 | 285 | 10 |
| 6 | 1296 | 506 | 20 |
| 7 | 2401 | 819 | 35 |

As show in the table, a R-type Chi-Yun compactor always supports more scan chains than a block compactor or an X-Compactor which uses the same number of external outputs. This implies that Chi-Yun compactors can achieve a higher compaction ratio (defined as the number of supported scan chains divided by the number of external outputs). It should be noted that a Chi-Yun compactor may further improve the compaction ratio by changing $W_R$ or C. However, a higher compaction ratio may not relate to a higher level of unknown tolerance. To build a good response compactor, its ability of minimizing unknown-induced masking has to be addressed. Otherwise, without considering this factor, one could simply XOR all the scan chains by a simple XOR tree and make the compaction ratio is high as one would like to.

Figure 3:
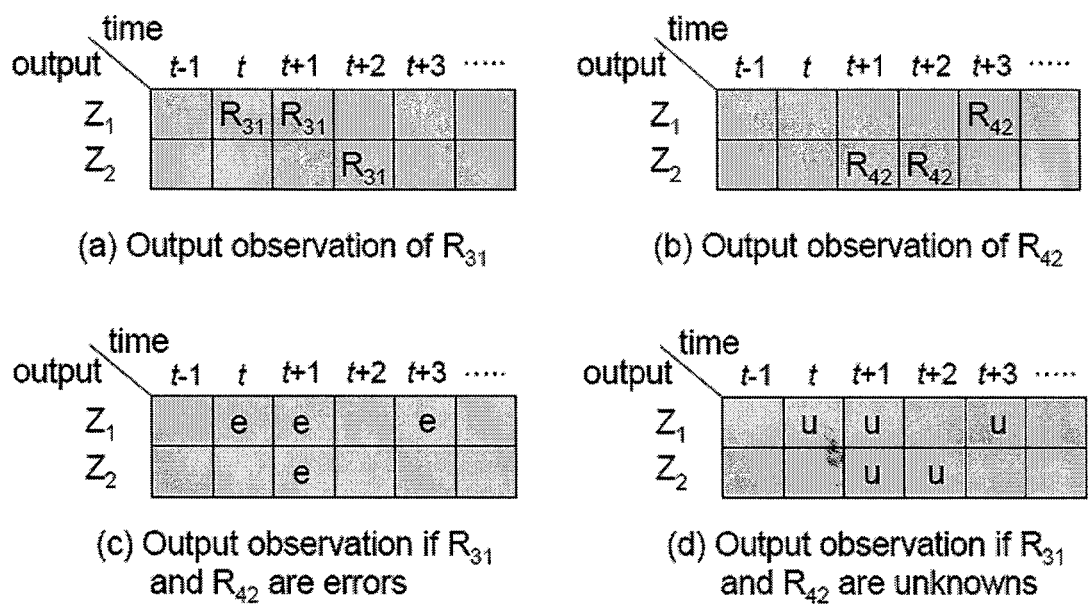
FIG. 3A through 3D are timing tables illustrating the propagation of responses in the compactor depicted in FIG. 2.

To identify which scan-out response would be masked by unknowns, it is useful to first map the unknowns among scan-out responses to a timing table as shown in FIG. 3. A tile in a timing table represents the value at an output in a scan-shift cycle. After mapping unknowns to the timing table, this timing table can indicate which output in which scan-shift cycle will observe an unknown. Based on the mapped tiles of these unknowns on the timing table, it is possible to find out which response cannot be observed by checking its corresponding mapped tiles in the timing table, such as responses $R_{71}$ and $R_{52}$ in FIG. 3D.

For a R-type Chi-Yun compactor, given the number of external outputs (Z) and the number of 1's per column ($W_R$), increasing the number of columns (C) in the XOR matrices can provide more scan-shift cycles for a response to be observed at external outputs. However, in this case, an unknown will also have more chances to propagate to external outputs. Therefore increasing C would also increase the probability that an external output observes an unknown in each scan-shift cycle. For example, in FIG. 2, eight 2×3 matrices are used for eight scan chains. The probability that any of the two external outputs may observe an unknown is contributed from the 24 column inputs (3 from each XOR matrix). If one enlarges the matrix size to 2×4, this unknown-observation probability is then contributed from all 32 column inputs.

The following table shows how different configurations of the matrix size in a R-type Chi-Yun compactor can affect the probability of a response being masked by unknowns and thus unobservable. In this example, Z=10 and $W_R$=1 to build the XOR matrices for 1000 scan chains. 0.1% of the output responses are randomly generated as unknowns.

|  | # of columns | | | | |
|---|---|---|---|---|---|
|  | C = 3 | C = 4 | C = 5 | C = 6 | C = 7 |
| unobservable % | 2.43 | 1.96 | 2.10 | 2.78 | 3.16 |

As the results above show, the percentage of unobservable responses does not always improve when using a larger C. The unobservable percentage increases when C increases. To further reduce the probability of a response being masked by unknowns, it is preferable that the number of XOR gates in a matrix does not necessarily go up when the number of its columns increases.

Figure 6:
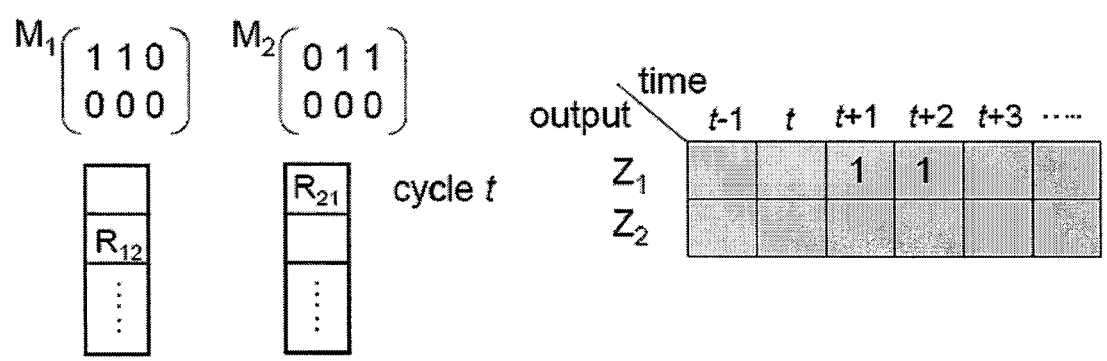
FIG. 6 illustrates how the horizontally-shifted versions of an XOR matrix for an F-type compactor interact.

In that context, it is advantageous to introduce another type of Chi-Yun compactor, referred to by the inventors as a flexible-type (F-type) Chi-Yun compactor. The difference between the R-type Chi-Yun compactor and a F-type Chi-Yun compactor is the way to construct their XOR sub-arrays. FIG. 5 shows one possible combination of XOR matrices for an 8-to-2 F-type Chi-Yun compactor. In a F-type Chi-Yun compactor, the total number of 1's in an XOR matrix is fixed, but the number of 1's in an XOR matrix is no longer a multiple of the number of columns (as for a R-type Chi-Yun compactor). One can select a proper number of 1's in an-XOR matrix to minimize the unknown-induced masking. Moreover, it is preferable that no XOR matrix be a horizontally-shifted version of another matrix in an F-type Chi-Yun compactor. FIG. 6 shows an example of how a horizontally-shifted version of an XOR matrix can affect the original XOR matrix. In FIG. 6, matrix $M_2$ is a one-column right-shifted version of $M_1$. If a response $R_{21}$ arrives at the XOR sub-array of $M_2$ in scan-shift cycle t and another response $R_{12}$ arrives at the XOR sub-array on $M^1$ in scan-shift cycle t+1, these two responses will be mapped to the same two tiles in the timing table, ($Z_1$, t+1) and ($Z_1$, t+2). It implies that if $R_{21}$ and $R_{12}$ are both errors, then they would mask each other. If one of them is an unknown, then the other response will become unobservable.

With the above two construction rules, a F-type Chi-Yun compactor can guarantee that no two errors can mask each other and no single error will be masked by a single unknown. If the number of 1's in a matrix (denoted as $W_F$) is odd, then no odd number of errors can be masked. Given the number of outputs Z, the number of columns C, and the number of 1's in a matrix $W_F$, the maximum number of supported scan chains Nmax for a F-type Chi-Yun compactor would be:

$$N_{max} = \sum_{i=1}^{min(Z,W_F)} \binom{Z}{i}\binom{Z \cdot C - C}{W_F - i}$$

The following table compares the two embodiments described above and lists the maximum number of supported scan chains of F-type compactors and R-type Chi-Yun compactors. The same parameters are used as those used for in the above table ($W_R=1$ and $C=4$) for the R-type compactors and the use the same total number of 1's in an XOR matrix for the F-type compactors ($W_F=4$).

|        | # of output |     |      |      |      |      |
| ------ | ----------- | --- | ---- | ---- | ---- | ---- |
|        | 2           | 3   | 4    | 5    | 6    | 7    |
| R-type | 16          | 61  | 256  | 625  | 1296 | 2401 |
| F-type | 69          | 425 | 1325 | 3025 | 5781 | 9849 |

The numbers shown in the table demonstrate that a F-type Chi-Yun compactor can support more scan chains than a R-type Chi-Yun compactor does for any number of external outputs in use.

The hardware overhead of a Chi-Yun compactor is proportional to the number of memory elements and XOR gates used for each scan chain. Given the numbers of scan chains ($N_{sc}$), matrix columns (C), and 1's in an XOR matrix ($W_F$), the following equations show the numbers of required memory elements ($N_{FF}$) and XOR gates ($N_{XOR}$) for a F-type Chi-Yun compactor.

$$N_{FF} = (C-1) \cdot N_{sc}$$

$$N_{Xor} = W_F \cdot N_{sc}$$

With a different number of matrix columns (C) and a different number of 1's in each matrix ($W_F$), the unknown tolerance of a Chi-Yun compactor could be different. The following table shows the percentages of unobservable responses with different C's but fixed $W_F$. The results indicate increasing C always reduces the unobservable percentage.

|          | C    |      |      |      |      |      |
| -------- | ---- | ---- | ---- | ---- | ---- | ---- |
|          | 3    | 4    | 5    | 6    | 10   | 20   |
| uaobs. % | 2.19 | 1.84 | 1.64 | 1.53 | 1.31 | 1.16 |

The next table shows the percentage of unobservable responses with different $W_F$'s but fixed C.

|          | $W_F$ |      |      |      |      |
| -------- | ----- | ---- | ---- | ---- | ---- |
|          | 3     | 4    | 5    | 6    | 7    |
| unobs. % | 2.35  | 2.10 | 2.19 | 2.48 | 2.94 |

As the results shown, increasing $W_F$ may not always help the unobservable percentage. The lowest unobservable percentage is achieved when $W_F=4$. The values of $W_F$ and C affect not only the unknown tolerance for a Chi-Yun compactor but also the hardware overhead. In order to efficiently derive the optimal values of $W_F$ and C for a Chi-Yun compactor, it is useful to derive a mathematical equation to predict the unobservable percentage by simple computation.

Figure 7:
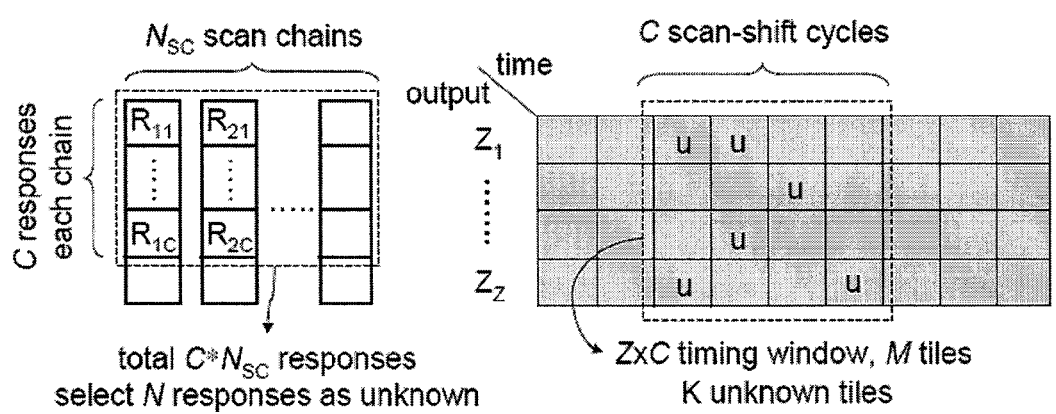
FIG. 7 illustrates a timing table and scan chains for equation derivation processing.

The parameters for calculating the percentage of unobservable responses include the number of scan chains ($N_{sc}$), the number of outputs (Z), the number of columns in each matrix C, the number of 1's in each column ($W_R$), and the probability that a scan-out response is an unknown (p). Consider a timing table (as shown in FIG. 7) with Z rows. In scan-shift cycle t, there are $C \cdot N_{sc}$ responses connecting to different XOR sub-arrays. Each of these responses affects the tiles in the timing table for a period of C scan-shift cycles. However, they may affect the tiles during a different period of C cycles. For example, in FIG. 3, responses $R_{31}$ and $R_{42}$ both affect the tile ($Z_2$, t+2). However, the tiles affected by $R_{31}$ are from cycle t to cycle t+2 and the tiles affected by $R_{42}$ are from cycle t+1 to t+3. The problem can be first simplified by assuming that those $C \cdot N_{sc}$ responses interact with one another during the same C scan-shift cycles, and the tiles in the timing table during these C scan-shift cycles, are only affected by these $C \cdot N_{sc}$ responses. So, now it is only necessary to consider the M tiles in this $Z \times C$ timing window, where $M = Z \cdot C$.

In the following analysis, we first try to find out the number of tiles marked as unknown (also called unknown tiles) in the $Z \times C$ timing window. Next, we try to find out which scan chains have an XOR matrix completely masked by those unknown tiles. An XOR matrix is completely masked by the unknown tiles if each 1 in that matrix will map to an unknown tile in the timing table (like the way we find out the unobservable responses in FIG. 3D). The following two random variables are defined: N is the number of unknowns among the $C \cdot N_{sc}$ responses; K is the number of unknown tiles in the timing window. The probability that K=k is:

$$Prob\{K = k\} = \frac{\binom{M}{k}}{\binom{M}{W_f}^N} \sum_{j=W_F}^{k} (-1)^{k-j} \cdot \binom{k}{j} \cdot \binom{j}{W_F}^N$$

The value of K ranges from $W_F$ to R, where $R = \min(M, N \cdot W_F)$. For a given N, the expectation value of a function of K, $f(K)$, can be expressed as:

$$E[f(K)] = \sum_{k=W_F}^{R} f(k) \cdot Prob\{K = k\} \quad (1)$$

$$= \sum_{j=0}^{M-W_F} (-1)^j \cdot \binom{M}{j} \cdot (\theta_j)^N \cdot$$

$$\sum_{i=0}^{j} (-1)^i \cdot \binom{j}{i} \cdot f(M-i) \text{ where, } \theta_j = \frac{\binom{M-j}{W_F}}{\binom{M}{W_F}}$$

The final summation in Equation (1) above has the following interesting property if $f(K)$ is a n-th degree polynomial of K: When j>n, $$\sum_{i=0}^{j} (-1)^i \cdot \binom{j}{i} \cdot f(M-i) = 0. \qquad (2)$$

After one determines the number of tiles marked as unknown (K) in this Z×C timing window, the total number of possible XOR matrices that is completely masked by these K unknowns is $$\binom{K}{W_F}.$$

Then the probability that a response arrives at a completely-masked XOR matrix is $$\binom{K}{W_F} \Big/ \binom{M}{W_F}, \text{ where } \binom{M}{W_F}$$

is the total number of possible XOR matrices based on M tiles. Therefore, by substituting $f(K)$ by $$\binom{K}{W_F} \Big/ \binom{M}{W_F},$$

one can calculate the expectation value of a response being masked by the unknowns. Note that $f(K)$ is a $W_{F\text{-}th}$ order polynomial of K. So by using the property described in Equation (1) above, one only needs to do the summation of j in Equation (2) up to $W_F$ (note that $W_F$ is always smaller than $M-W_F$ in practice). In summary, the expectation value of $$f(K) = \binom{K}{W_F} \Big/ \binom{M}{W_F} \text{ is:}$$

$$E[f(K)] = \sum_{i=0}^{W_F} (-1)^i \cdot \binom{M}{j} \cdot (\theta_j)^N \cdot \sum_{i=0}^{j} (-1)^i \cdot \binom{j}{i} \cdot \frac{\binom{M-i}{W_F}}{\binom{M}{W_F}}$$

$$= \sum_{i=0}^{W_F} (-1)^j \cdot (\theta_j)^N \cdot \binom{W_R}{j}$$

If the probability of a scan-out response being an unknown (p) is the same for every response, N can be represented by the following binomial distribution:

$$\text{Prob}\{N = n\} = \binom{C \cdot N_{sc}}{n} \cdot p^n \cdot (1-p)^{C \cdot N_{sc} - n}.$$

Then, the expectation $E[f(K)]$ in the equation above can be re-expressed as a function of $N(E_N[f(K)])$, and actual expectation value of $f(K)$ is:

$$E[f(K)] = \sum_{n=0}^{C \cdot N_{sc}} \text{Prob}\{N = n\} \cdot E_N[f(K)]$$

$$= \sum_{j=0}^{W_F} (-1)^j \cdot \binom{W_F}{j} \cdot (p \cdot \theta_j + 1 - p)^{C \cdot N_{sc}}$$

Note that some of the derivation details from the above have been omitted, and in the derivation, we have also made some assumptions to simplify the analysis so that a closed form can be derived.

The following table shows the predicted unobservable percentages obtained by the above equation. The same parameters are used as above. The "*" symbol in the table indicates the lowest unobservable percentage for the simulation result or the predicted result.

|  | $W_F$ | | | | |
| --- | --- | --- | --- | --- | --- |
|  | 3 | 4 | 5 | 6 | 7 |
| simulation % | 2.35 | 2.10* | 2.19 | 2.48 | 2.94 |
| predicted % | 2.61 | 2.44* | 2.67 | 3.19 | 3.97 |

As shown in the table, both simulation and prediction indicates that $W_F=4$ would generate the lowest unobservable percentage for the given parameters. Although the predicted results do not precisely match the numbers derived by simulation, their difference is small and, most importantly, the predicted results can accurately identify the optimal configuration of a F-type Chi-Yun compactor.

In the following table, it is further shown the predicted unobservable percentages for different C's with a comparison of the predicted results with simulation results.

| | | $W_F$ | | | | |
| --- | --- | --- | --- | --- | --- | --- |
| C | | 3 | 4 | 5 | 6 | 7 |
| 3 | simulation % | 2.35 | 2.10* | 2.19 | 2.48 | 2.94 |
|   | predicted % | 2.61 | 2.44* | 2.67 | 3.19 | 3.97 |
| 4 | simulation % | 2.21 | 1.84* | 1.86 | 1.99 | 2.33 |
|   | predicted % | 2.39 | 2.11* | 2.19 | 2.51 | 3.03 |
| 5 | simulation % | 2.13 | 1.72 | 1.64* | 1.73 | 1.96 |
|   | predicted % | 2.26 | 1.91* | 1.92 | 2.14 | 2.52 |
| 6 | simulation % | 2.07 | 1.64 | 1.53* | 1.58 | 1.78 |
|   | predicted % | 2.17 | 1.79 | 1.75* | 1.90 | 2.20 |

Again, the predicted results can be used to identify the optimal number of $W_F$ except in one case. The only exception is for C=5. In this case, the predicted results for $W_F=4$ and $W_F=5$ are almost the same, and the difference of their simulation results is relatively small too.

Several other parameters, such as the number of external outputs (Z), the number of scan chains ($N_{sc}$), and the percentage of unknown responses (p), may also affect the unobservable percentage and, thus, result in different optimal $W_F$'s. The following table shows the predicted and simulation results for several different combinations of parameters.

| parameters | | $W_F$ | | | | |
|---|---|---|---|---|---|---|
| | | 3 | 4 | 5 | 6 | 7 |
| Z = 10, $N_{SC}$ = 500 | simulation % | 15.66* | 17.71 | 20.91 | 25.30 | 30.34 |
| C = 4, p = 0.005 | predicted % | 16.03* | 18.41 | 22.21 | 27.04 | 32.60 |
| Z = 10, $N_{SC}$ = 500 | simulation % | 0.562 | 0.418 | 0.371* | 0.379 | 0.409 |
| C = 5, p = 0.001 | predicted % | 0.595 | 0.445 | 0.421* | 0.460 | 0.549 |
| Z = 5, $N_{SC}$ = 250 | simulation % | 0.647 | 0.614* | 0.677 | 0.870 | 1.043 |
| C = 3, p = 0.001 | predicted % | 0.961 | 0.934* | 1.118 | 1.489 | 2.085 |
| Z = 5, $N_{SC}$ = 250 | simulation % | 0.448 | 0.364 | 0.312* | 0.318 | 0.347 |
| C = 6, p = 0.001 | predicted % | 0.595 | 0.445 | 0.421* | 0.460 | 0.549 |
| Z = 10, $N_{SC}$ = 250 | simulation % | 0.169 | 0.129 | 0.117 | 0.111 | 0.110* |
| C = 5, p = 0.001 | predicted % | 0.098 | 0.047 | 0.030 | 0.024 | 0.022* |

This mathematical analysis enables the finding of near-optimal combination of $W_F$ and C for minimal unobservable percentage without tedious, brute-force simulation. If one is allowed to change the scan design, one can further change the number of scan chains to satisfy a target unobservable percentage and hardware overhead of the compactor.

As mentioned above, if the number of 1's in each matrix ($W_F$) is odd, no odd number of errors can mask one another. When designing a Chi-Yun compactor, however, it should be noted that it is not necessary to follow this rule. To demonstrate this point, the inventors ran fault simulation on two test circuit patterns without any unknowns and used a F-type Chi-Yun compactor with an even $W_F$. The results showed that no error values (or so-called faulty values) of a single fault are completed cancelled out. Therefore, in practice, ensuring no two errors can cancel each other would be sufficient for avoiding any even-error masking. So, when choosing $W_F$, one only needs to consider its unobservable percentage induced by unknowns. The value of $W_F$ need not be odd.

The discussion above has focused on how to improve the percentage of unobservable responses by changing the configuration of a Chi-Yun compactor. Note that reducing the unobservable percentage can also increase the probability of a fault being detected. Thus, for most of the cases, a lower unobservable percentage also leads to a higher fault coverage. However, this statement is not always true. There is no guarantee for this statement. For example, when performance simulations are preformed using a Chi-Yun compactor and a block compactor (with $N_{sc}$=500, C=4, and p=0.001), the Chi-Yun compactor can be shown to have a lower unobservable percentage but has more undetected faults than that of the block compactor. It should be noted, however, that the information obtained from fault simulation can be used to add control signals to observe some specific responses which were originally masked by the unknowns. By selecting and adding such control signals, one could improve the fault coverage.

Figure 8:
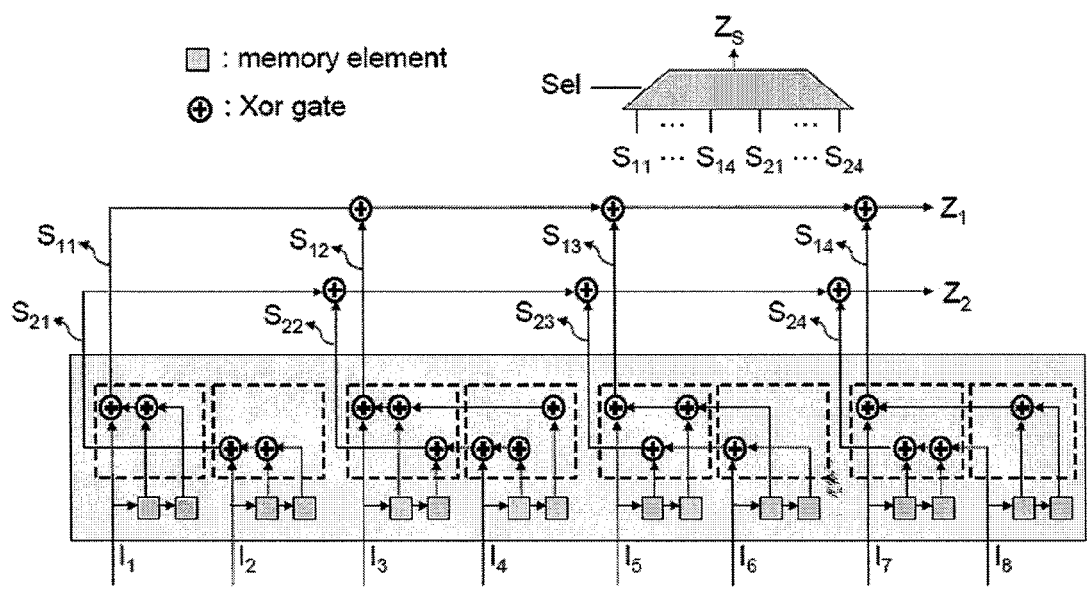
FIG. 8 is a block diagram of an exemplary compactor with a selection scheme, arranged in accordance with another embodiment of the present invention.

FIG. 8 shows the design of a Chi-Yun compactor with the proposed selection scheme. This Chi-Yun compactor is modified from the exemplary Chi-Yun compactor in FIG. 2. The external outputs $Z_1$ and $Z_2$ here receive the same results as those in the Chi-Yun compactor in FIG. 2. The first difference of this modified Chi-Yun compactor is the connection among the XOR sub-arrays. Instead of connecting the ith row in an XOR sub-array directly to the ith row of the left-next XOR sub-array, we divide the entire XOR network into eight segments. Each segment $S_{ij}$ collects part of the XOR result in the ith row. The output $Z_i$ observes the XOR results of all segments in the ith row. The second difference is that one extra external output $Z_S$ and one extra control signal Sel are used in this selection scheme. By specifying the signal Sel, output $Z_S$ can directly observe the XOR result on a targeted segment. If we select to observe the XOR result from segment $S_{ij}$, the observed result will be independent of the other segments.

When an error propagates to an output $Z_i$, the error might be masked by an unknown in the ith row. However, this error may be detectable by direct observation of its corresponding segment, through $Z_S$, if no unknown is in this segment. For example, FIG. 9A shows the timing table when both $R_{31}$ and $R_{42}$ are unknowns (which is the same example as FIG. 3D). If $R_7$ is an error (as shown in FIG. 9B), then this error cannot be observed at neither $Z_1$ nor $Z_2$ during scan-shift cycles t to t+2. With the selection scheme, if segment $S_{24}$ is selected in scan-shift cycle t, this error can be observed at output $Z_S$ in scan-shift cycle t. For a Chi-Yun compactor, an error could propagate to an output in multiple scan-shift cycles. So this selection scheme offers multiple chances to directly observe an originally-masked error at the output $Z_S$.

An important property of this selection scheme is that no matter how one selects a segment to observe at output $Z_S$, the result observed at the original outputs ($Z_1$-$Z_2$ in FIG. 8) remains the same. Therefore, most of the ATPG-detected faults are already detected by the original Chi-Yun compactor without this selection scheme. To consider which segments to observe at output $Z_S$, one only needs to focus on the faults which cannot be detected by the original Chi-Yun compactor. Those faults are denoted herein as "Chi-Yun-undetected faults."

The selection signal generation can proceed in two stages as follows. The first stage is to identify the Chi-Yun-undetected faults. The second stage is to specify the value at signal Sel to detect those Chi-Yun-undetected faults. The objective of the processing is to detect as many Chi-Yun-undetected faults as possible. In the first stage, fault simulation, based on the original Chi-Yun compactor, is performed to identify the Chi-Yun-undetected faults. For each Chi-Yun-undetected fault, one also records how many times that the fault effects appear in the scan cells (i.e. the responses in the scan cells are erroneous) but those responses are all masked by unknowns. This count is denoted as masked_count. In the second stage, another fault simulation run is performed only for those Chi-Yun-undetected faults. A value is assigned at Sel for each scan-shift cycle and for each pattern. For each-scan shift cycle of each pattern a value is specified at Sel to observe errors of those Chi-Yun-undetected faults at $Z_S$. If an error of a Chi-Yun-undetected fault is observed at $Z_S$, the fault is then dropped from the fault list; If a Chi-Yun-undetected fault produces erroneous scan-out responses but none of those erroneous responses can be observed by the specified value at Sel, the masked_count of that fault is then decreased by 1. When masked_count=1, it means that this Chi-Yun-undetected fault cannot be detected by any future assignment of the Sel value if we miss this last chance when this fault produces erroneous scan-out responses. Therefore, a Chi-Yun-undetected fault with masked_count=1, it is denoted as an urgent fault; for a fault with masked_count>1, it is denoted as a non-urgent fault. When the value is determined at Sel, the first goal is to detect as many urgent faults as possible. If several values at Sel can detect the same maximal number of urgent faults, the second goal is to detect as many non-urgent faults as possible.

It can be shown through simulation that the selection scheme can significantly reduce the fault coverage loss caused by the output compactor. It should be noted that the fault coverage improvement does not come without a price. One extra external output and several control bits for selection signal Sel are needed. For example, if 32 segments are used in the selection scheme, 5 bits are required for the selection signal Sel. Fortunately, the value at signal Sel need not be specified in every scan-shift cycle. For the scan-shift cycles in which no specific value at Sel is required, the value at Sel can be made a "don't care." Therefore, the control data for signal Sel can be further compressed through a input compression scheme. The percentage of scan-shift cycles in which a specified value at Sel is required can be very low, as low as 1% in a circuit with a large number of scan flip-flops, thus requiring a limited overhead of control data for the selection scheme.

While exemplary drawings and specific embodiments of the present invention have been described and illustrated, it is to be understood that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow and their structural and functional equivalents.

What is claimed is:

1. A method of compacting test response data from a circuit, the method comprising:
   receiving test response values from a plurality of scan chains and from different scan-shift cycles within a scan chain;
   combining the test response values using a plurality of sub-arrays of logic gates thereby directly generating a plurality of output values at a plurality of external outputs, the number of external outputs being less than the number of scan chains, and the sub-arrays of logic gates arranged so as to minimize masking of errors in the test response data.

2. The method of claim 1 wherein the logic gates are XOR gates.

3. The method of claim 1 wherein the test response values in a scan chain are stored in one or more memory elements, thereby providing the plurality of sub-arrays of logic gates with access to test response values from different scan-shift cycles within a scan chain.

4. The method of claim 1 wherein each sub-array can be represented as a $Z \times C$ matrix, where Z is the number of external outputs and C is a number of different scan-shift cycles within a scan chain used.

5. The method of claim 4 wherein the matrix representing a sub-array has a same number of logic gates in each column of the matrix and wherein no two matrices are identical.

6. The method of claim 4 wherein there are a fixed number of logic gates within each sub-array and no sub-array is represented by a matrix which is a horizontally-shifted version of another sub-array's matrix.

7. The method of claim 1 wherein the sub-arrays of logic gates are grouped into a plurality of segments such that control signals can be used to block a segment from being combined to one of the plurality of external outputs, the control signals selected so as to minimize masking by unknown values.

8. A logic testing architecture comprising:
   a plurality of scan chains;
   a plurality of external outputs, the number of external outputs being less than the number of scan chains;
   a plurality of sub-arrays of logic gates, each sub-array coupled to a scan chain, the logic gates in a sub-array arranged so as to propagate and combine test response values from different scan-shift cycles within the plurality of scan chains to directly generate output values at each of the external outputs.

9. The logic testing architecture of claim 8 wherein the logic gates are XOR gates.

10. The logic testing architecture of claim 8 wherein each sub-array further comprises one or more memory elements storing test response values from different scan-shift cycles within a scan chain.

11. The logic testing architecture of claim 8 wherein each sub-array can be represented as a $Z \times C$ matrix, where Z is the number of external outputs and C is a number of different scan-shift cycles within a scan chain used.

12. The logic testing architecture of claim 11 wherein the matrix representing a sub-array has a same number of logic gates in each column of the matrix and wherein no two matrices are identical.

13. The logic testing architecture of claim 11 wherein there are a fixed number of logic gates within each sub-array and no sub-array is represented by a matrix which is a horizontally-shifted version of another sub-array's matrix.

14. The logic testing architecture of claim 8 wherein the sub-arrays of logic gates are grouped into a plurality of segments such that control signals can be used to block a segment from being combined to one of the plurality of external outputs, the control signals selected so as to minimize masking by unknown values.

15. A logic testing architecture comprising:
   a plurality of scan chains;
   a plurality of external outputs, the number of external outputs being less than the number of scan chains;
   a plurality of logic gates coupling the scan chains to the external outputs, the plurality of logic gates arranged as a time-folding matrix which couples unique sets of external outputs to each scan chain.

16. The logic testing architecture of claim 15 wherein the logic gates are XOR gates.

* * * * *